(12) United States Patent
Schuster et al.

(10) Patent No.: US 11,142,822 B2
(45) Date of Patent: Oct. 12, 2021

(54) METHOD FOR DEPOSITING A COATING BY DLI-MOCVD WITH DIRECT RECYCLING OF THE PRECURSOR COMPOUND

(71) Applicant: COMMISSARIAT A L'ENERGIE ATOMIQUE ET AUX ENERGIES ALTERNATIVES, Paris (FR)

(72) Inventors: Frédéric Schuster, St. Germain-en-Laye (FR); Francis Maury, Labege (FR); Alexandre Michau, Toulouse (FR); Michel Pons, La Tronche (FR); Raphaël Boichot, Domene (FR); Fernando Lomello, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/669,854

(22) Filed: Oct. 31, 2019

(65) Prior Publication Data

US 2020/0123655 A1 Apr. 23, 2020

Related U.S. Application Data

(63) Continuation of application No. 16/063,405, filed as application No. PCT/FR2016/053541 on Dec. 17, 2016, now abandoned.

(30) Foreign Application Priority Data

Dec. 18, 2015 (FR) ...................................... 1562862

(51) Int. Cl.
*C23C 16/448* (2006.01)
*C23C 16/18* (2006.01)
(Continued)

(52) U.S. Cl.
CPC .......... *C23C 16/4486* (2013.01); *B01D 5/006* (2013.01); *B01D 8/00* (2013.01);
(Continued)

(58) Field of Classification Search
None
See application file for complete search history.

(56) References Cited

U.S. PATENT DOCUMENTS

| 5,077,091 A | 12/1991 | Nowak |
| 8,343,582 B2 | 1/2013 | Maury et al. |

(Continued)

FOREIGN PATENT DOCUMENTS

| EP | 1664379 B1 | 4/2010 |
| JP | H0412525 A | 1/1992 |

(Continued)

OTHER PUBLICATIONS

Douard et al., Nanocrystalline chromium-based coatings deposited by DLI-MOCVD under atmospheric pressure from Cr(CO)6, Surface & Coatings Technology, pp. 6267-6271, vol. 200 (Dec. 2005).

(Continued)

*Primary Examiner* — Joel G Horning
(74) *Attorney, Agent, or Firm* — Browdy and Neimark, PLLC

(57) ABSTRACT

Process for the chemical vapor deposition by DLI-MOCVD on a substrate of a protective coating composed of at least one protective layer comprising a transition metal M:
  a) having available, in a feed tank, a mother solution containing a hydrocarbon solvent devoid of oxygen atom and a precursor of bis(arene) type containing the transition metal M to be deposited, and, if appropriate, a carbon-incorporation inhibitor;
  b) vaporizing said mother solution and introducing it into a CVD reactor in order to carry out the deposition of the protective layer on said substrate;
(Continued)

c) collecting, at the outlet of the reactor, a fraction of the gaseous effluent comprising the unconsumed precursor, the aromatic byproducts of the precursor and the solvent, these entities together forming a daughter solution, and;

d) pouring the daughter solution thus obtained into the feed tank in order to obtain a new mother solution capable of being used in step a).

21 Claims, 5 Drawing Sheets

(51) Int. Cl.
*C23C 16/32* (2006.01)
*C23C 16/44* (2006.01)
*B01D 5/00* (2006.01)
*B01D 8/00* (2006.01)

(52) U.S. Cl.
CPC .............. *C23C 16/18* (2013.01); *C23C 16/32* (2013.01); *C23C 16/4412* (2013.01)

(56) References Cited

U.S. PATENT DOCUMENTS

| | | |
|---|---|---|
| 8,431,190 B2 | 4/2013 | Maury et al. |
| 2005/0064211 A1 | 3/2005 | Deavenport |
| 2009/0324822 A1 | 12/2009 | Maury |
| 2011/0203310 A1 | 8/2011 | Gomi et al. |
| 2014/0127404 A1 | 5/2014 | Yudovsky |

FOREIGN PATENT DOCUMENTS

| | | |
|---|---|---|
| JP | 2010-037631 A | 2/2010 |
| JP | 2014154792 A | 8/2014 |
| JP | 2015-151564 A | 8/2015 |
| RU | 2513496 C2 | 12/2013 |
| SU | 1759958 A1 | 9/1992 |
| SU | 1453950 A1 | 6/1994 |
| WO | 2007106462 A2 | 9/2007 |
| WO | 2008009714 A1 | 1/2008 |
| WO | 2008009715 A1 | 1/2008 |

OTHER PUBLICATIONS

Douard et al., " Thermodynamic simulation of atmospheric DLI-CVD processes for the growth of chromium-based hard coatings using bis(benzene)chromium as molecular source", Surface and Coatings Technology, pp. 516-520, vol. 2013 (2008).

Maury et al.,"Multilayer chromium based coatings grown by atmospheric pressure direct liquid injection CVD", Surface & Coatings Technology, pp. 983-987, vol. 204 (Apr. 2009).

Boisselier et al., Growth of chromium carbide in a hot wall DLICVD reactor, Journal of Nanoscience and Nanotechnology, 11:8289-8293 (2011).

G. Boisselier, et al., Growth of Chromium Carbide in a Hot Wall DLICVD Reactor, Journal of Nanoscience and Nanotechnology, Apr. 28, 2011, Vo.11, pp. 8289-8293.

Japanese Notice of Reasons for Refusal for JP Patent Application No. 2018-531355 dated May 22, 2020.

Japanese Office Action dated Jan. 15, 2021, in Japanese Patent Application No. 2018-531355 and English machine translation.

METHOD FOR DEPOSITING A COATING BY DLI-MOCVD WITH DIRECT RECYCLING OF THE PRECURSOR COMPOUND

TECHNICAL FIELD

The present invention belongs to the field of treatments for the protection of structural parts operating under severe conditions against wear, corrosion and/or oxidation at high temperature. It more particularly relates to a process for chemical vapor deposition of coatings on surfaces to be protected.

A subject matter of the invention is a process for the deposition by the dry route of metal or ceramic layers under reduced pressure and at low temperature, by direct injection into a reactor of a solution of molecular precursor of a metal to be deposited, the effluent from the reaction being collected in order to feed said process with a recycled solution of precursor.

TECHNICAL BACKGROUND

The engineering industry (tools, items of industrial equipment, automobile industry, aeronautical industry, and the like) and the electronics industry (semiconductors, photovoltaics) have an increasing need for materials which withstand severe production and/or use conditions. In order to improve their resistance and prolong their lifetime, parts made of ceramics, steels or alloys are coated with a layer with a thickness of a few microns composed of a non-oxide ceramic material of carbide, nitride or carbonitride type or of a metal element, alone or alloyed. This coating improves the mechanical properties of these parts, and also their wear and corrosion resistance. It can be produced in a monolithic form or nanostructured form as multilayers of the same or different nature.

The coatings based on chromium or on other transition metals with similar properties are widely used for the protection of parts against wear and corrosion. In the electronics industry, the coatings deposited are even thinner films which contribute the functional property essential to the system.

Different techniques can be employed to produce these coatings. For a long time, metallurgical coatings (metals, carbides, nitrides, and the like), among others based on chromium, have been essentially obtained by the electroplating bath method (or galvanoplasty). This process was easy to carry out for the treatment with forward progression at very low temperature (less than 100° C.) of parts of all sizes but it gave microcracked coatings which were weak with regard to corrosion. In particular, the processes for deposition by the wet route were banned in 2007 by European environmental standards as a result of the carcinogenic effects of the hexavalent chromium solutions which they used. With regard to the methods employing trivalent chromium, still currently used, they should also be banned soon.

Alternative techniques for deposition by the dry route, known as clean techniques, have been provided, including chemical deposition techniques, such as chemical vapor deposition (abbreviated as "CVD" in English), which are controlled and already used in the production of certain coatings.

For example, the chemical vapor deposition of a metal, of nitrides, carbides or carbonitrides of metal elements, from a cement composed of a metal powder in contact with a volatile reducing compound, is known. This process operates at atmospheric pressure but the deposits are obtained solely at high temperature as a result of the metal source of halide type employed. Conventional CVD processes use the vapors of the halide directly as source of metal and for their part operate under dynamic vacuum and at high temperature (of the order of 1000° C.).

From the viewpoint of the environmental and safety conditions, the use of halide precursors which are thermally robust, toxic, corrosive and of limited volatility, which are employed at high deposition temperatures, constitutes a major disadvantage of these processes. Further, the severe thermal conditions limit the possible variety of the substrates to be coated.

In order to lower the deposition temperatures, organometallic molecular precursors have been used (process abbreviated in English as "MOCVD" for "Metal Organic CVD"), which are described in more detail below. However, in view of the low volatility and the thermal instability of these compounds, which are often powders, it is necessary to operate under reduced pressure. The prolonged heating of the precursor in the sublimation zone (if it is a solid) or vaporization zone (if it is a liquid), even at low temperature, can damage the reactant before it arrives at the deposition zone, thus causing problems of reproducibility for the precursor throughput, the initial reactive gas composition and thus the quality of deposition.

These difficulties have been overcome by virtue of a process comprising the principle of chemical vapor deposition and the liquid injection of an organometallic precursor of the metal compound to be deposited, known as DLI-MOCVD according to the English acronym for "Direct Liquid Injection—Metal Organic Chemical Vapor Deposition".

This DLI-MOCVD process exhibits the advantage of operating at low temperature and under reduced pressure (or even at atmospheric pressure) but imposes very specific reaction conditions for the deposition of protective layers based on a metal or on a carbide of this metal, having the required characteristics of homogeneity and of robustness. Reference may be made, on this subject, to the techniques described in WO 2008009714 as regards hard coatings of metal elements (chromium or other transition metals), and also to those described in WO 2008009715 as regards the deposition of coatings of non-oxide ceramic type of metal elements.

These dynamic synthesis methods (open systems) exhibit certain advantages but they employ reactants (such as halides, hydrides, hydrocarbons, organometallic compounds, and the like) which are far from being completely consumed during the reaction. The reactants, the solvent and their byproducts are thus re-encountered at the outlet of the reactor, requiring manufacturers to take measures to treat these gaseous and liquid effluents. This represents a waste of sophisticated products which is condemned out of environmental concerns, and also a significant economic loss.

These losses are all the greater as, in order to obtain good quality of the coatings in terms of uniformity of thickness, of microstructure (among others of density) conferring the required resistance properties, moderate deposition rates have to be employed. The yields of the process are then relatively low.

In point of fact, the design of environmentally friendly industrial processes is one of the major objectives of current research, responding among others to the European directives drawn up during the Gothenburg summit in 2001. The development of CVD processes and very particularly DLI-MOCVD processes is thus subject to their environmental impact (discharge of effluents, for example gases, solvent, heavy metals) and to their economic impact (energy cost, precursors—among others organometallic compounds-, substrates, and the like).

CVD processes which use large volumes of gases and of complex organometallic and organic compounds are affected.

Starting from this observation, several paths may be envisaged in order to influence the consumption of energy, the consumption of molecular precursors and the consumption of gases, whether carrier gases, providing good hydrodynamics in the reactor, or reactants.

The first path, currently the one most explored, is an optimization of the yield varying the parameters of the DLI-MOCVD process in order to reduce the deposition times. However, the quality requirements of the coatings are so great and so sensitive to the deposition conditions that the windows for variation in the production parameters are too narrow to reconcile all the constraints.

The second path would be to reduce the consumption of the reactants and of the process gases (gases used in the process but which are not involved as reactants, such as a carrier gas). Attempts to modify the reaction conditions in order to reduce the amount of reactants which is injected into the reactor have not, unfortunately, made it possible to obtain the desired coatings. For the above-mentioned reasons, the possibilities of varying the parameters of the process are here again greatly reduced.

In order to meet this challenge, the authors of the present invention have thought, not of modifying the reaction conditions as such by reducing the total amount of reactants injected into the reactor, but of reusing the compounds discharged at the reactor outlet, in order to recycle them in the process.

CVD processes employing a recycling step have already been provided. For example, CVD processes where a graphene/Cu substrate is recycled, the metal also being the catalyst, are known (Wang, Y., et al., ACS Nano, 2011, 5(12), pp 9927-9933). The recovery of the precious metals used in electronics (Pt, Ru, Au, and the like) in the effluents, in the form either of metals or of precursors, recycled for subsequent use, after the appropriate chemical treatments, is also known (International, R. 2010; accessible on the site http://www.recyclinginternational.com/recycling-news/3464/research-and-legislation/japan/Japanese-recycling-process-ruthenium-precursors). These technological solutions, which are targeted at lowering the overall cost, are very limited and are not applicable in DLI-MOCVD.

Solutions have been provided for some CVD processes consuming large amounts of gases and reactants, for example for the industrial production of carbon nanotubes. The relatively simple mixture of hydrocarbons $H_2/C_2H_4$ produces no less than 45 byproducts, including Volatile Organic Compounds (VOCs) and Polycyclic Aromatic Hydrocarbons (PAHs) (Plata, D. L., et al., Environmental Science & Technology, 2009, 43(21), pp 8367-8373). While the trapping and the recycling of these compounds make it possible to use them subsequently, it is at the price of a complex and expensive treatment, carried out in parallel with the CVD deposition process, for the purpose of an indirect recycling of these compounds, but not directly in the process itself, for example in a closed or semi-closed loop with reinjection of the compounds into the CVD reactor.

Recycling systems are also used in the bulk production by CVD of polycrystalline silicon for photovoltaic and microelectronic applications. For example, the beneficial effect of the loop recycling on the uniformity in thickness of the polycrystalline silicon films obtained in a tubular reactor by low-pressure CVD using the reactant mixture $SiH_4/H_2$ is known. The thickness of the film is all the more uniform as the gases are continually and perfectly stirred, which the recycling contributes to producing (Collingham, M. E., et al., Journal of the Electrochemical Society, 1989, 136(3), pp 787-794).

For the solar industry, the CVD process uses $SiCl_4$ and $H_2$ in large excess, a converter transforming $SiCl_4$ into $HSiCl_3$ for more rapid growth of Si. Only 20% of $HSiCl_3$ is consumed and byproducts are formed (chlorosilanes, HCl, $H_2$). The effluents are collected, separated and stored for another use, while unconsumed $HSiCl_3$ is recycled in the process (Project, P. P. 2010; Vent Gas Recovery and Recycle Process Technology Package, accessible on the site: www.polyplantproject.com/offgasrecoveryrecycling.html). With this CVD process with chlorides, a virtually closed loop system has been provided by varying the stripping/deposition equilibrium of the chemical system and by relying on the thermodynamic and kinetic simulation (Noda, S., et al., Conference Record of the Twenty-Ninth IEEE, 2002). Moreover, the recycling of $H_2$ via a system incorporated in a process using $SiH_4/H_2$ has recently been developed (V. Revankar and S. Lahoti, 2015, Savi Research Inc.).

However, in all the technologies for deposition of silicon by CVD exhibiting a loop recycling, the reaction byproducts are small in number. They are hydrides derived from $SiH_4$, halides derived from $SiCl_4$ or hydrocarbons resulting from $CH_4$ in the case of the deposition of carbon which are all gaseous at the operating temperature and have the same thermal behavior as the initial precursor. They constitute reactive sources for the deposition which have virtually no effect on the mechanism of growth or on the reaction kinetics.

The document WO 2007106462 provides for recycling at least one portion of the effluents produced by an MOCVD deposition process while recommending a step of purification of these effluents which is targeted in particular at separating the unreacted organometallic precursors from the byproducts of the reaction.

It thus appears that no process allows to date the satisfactory recycling of the compounds involved in processes for the deposition of films by DLI-MOCVD. Due to their high reactivity and the complexity of the mechanism of decomposition of the organometallic precursors, numerous and very different byproducts are generated. It is expected that the recycled product will not meet the conditions initially required and that the purity, the microstructure and the kinetics of growth of the coatings will be significantly affected thereby.

DESCRIPTION OF THE INVENTION

One of the aims of the invention is thus to avoid or to alleviate one or more of the disadvantages described above, and in particular to reduce, indeed even eliminate, the use, the generation and the discharge of substances harmful to the environment, during the preparation of protective coatings on mechanical parts or other parts.

In this context, one objective of the invention is to provide an environmentally friendly chemical deposition process, by avoiding as much as possible the production of waste resulting from the chemical deposition reactions rather than investing in their removal.

Another objective of the invention is to offer a deposition process which minimizes the industrial constraints and the energy needs, so as to limit the economic and environmental impact of the process.

Another objective of the invention is to reuse the compounds formed and/or unconsumed.

These objectives are sought for, with the maintenance of, if not the improvement in, the quality and the performance levels of the coatings obtained with the conventional technologies.

In order to meet one or more of these objectives, a subject matter of the invention is a process for the deposition of a protective coating on a substrate according to the DLI-MOCVD technique, in which process some effluents present at the reactor outlet are collected and then recycled in the deposition process without damaging its performance levels or the quality of the deposits.

The present invention thus relates to a process for the deposition on a substrate of a protective coating composed of one or more layers, at least one being a protective layer comprising a transition metal M in the form of at least one protective material chosen from a carbide, an alloy or a metal, the deposition process being a process for the chemical vapor deposition of an organometallic compound by direct liquid injection (DLI-MOCVD) which comprises the following steps:

a) having available, in a feed tank, a mother solution containing:
  a hydrocarbon solvent devoid of oxygen atom,
  said organometallic compound composed of a precursor of bis(arene) type having a decomposition temperature of between 300° C. and 600° C. and comprising the transition metal M, and
  if appropriate, a carbon-incorporation inhibitor;

b) vaporizing said mother solution in an evaporator and then introducing it into a chemical vapor deposition reactor in which said substrate to be covered is found; in order to carry out, in the chamber of the reactor, the atmosphere of which is at a deposition temperature of between 300° C. and 600° C. under reduced deposition pressure, the deposition of the protective layer on said substrate;

c) collecting, at the outlet of the reactor, a fraction of the gaseous effluent comprising the unconsumed precursor, the aromatic byproducts of the precursor and the solvent, these entities together forming, under standard conditions, a daughter solution, and;

d) pouring the daughter solution thus obtained into the feed tank in order to obtain a new mother solution capable of being used in step a).

DETAILED DESCRIPTION OF THE INVENTION

In the present description of the invention, a verb, such as "to comprise", "to incorporate", "to include", "to contain", "composed of", and its conjugated forms are open terms and thus do not exclude the presence of one or more supplementary elements or steps additional to the initial elements or steps set out after these terms. These open terms are targeted further at a specific embodiment in which only the initial element(s) and/or step(s), with the exclusion of any other, are targeted; in which case, the open term is further targeted at the closed term "to consist of", "to be constituted of" and its conjugated forms.

The use of the indefinite article "a" or "an" for an element or a step does not exclude, unless otherwise mentioned, the presence of a plurality of elements or steps.

Furthermore, unless otherwise indicated, the values at the limits are included in the ranges of parameters indicated.

Still in the present description, any alloy is generally a base alloy. "Base alloy" of the metal participating among others in the composition of the protective layer or of the substrate to be covered denotes any alloy based on the metal in which the content of the metal is at least 50% by weight of the metal of the alloy, more particularly more than 90%, indeed even more than 95%. The base metal is more particularly a transition metal M preferably chosen from Cr, Nb, V, W, Mo, Mn or Hf, which forms the corresponding base alloy of the transition metal M.

An alloy can also contain other chemical elements (for example at a content of greater than 0.5 atomic %), in particular a second metal element (such as, for example, a second transition metal M), in order to constitute a mixed alloy.

The element carbon inserted into an alloy forms a carbide of the alloy which can also be mixed in the presence of a second metal element (for example, a second transition metal M).

The deposition process according to the invention essentially comprises deposition steps a) and b) and recycling steps c) and d).

The deposition steps are carried out according to the DLI-MOCVD technique. This method is described, for example, in the following documents: "F. Maury, A. Douard, S. Delclos, D. Samelor and C. Tendero; Multilayer chromium based coatings grown by atmospheric pressure direct liquid injection CVD; Surface and Coatings Technology, 204 (2009), 983-987", "A. Douard and F. Maury; Nanocrystalline chromium-based coatings deposited by DLI-MOCVD under atmospheric pressure from $Cr(CO)_6$; Surface and Coatings Technology, 200 (2006), 6267-6271", WO 2008009714 and WO 2008009715.

The CVD reactor used in the DLI-MOCVD technique is generally a hot-wall reactor conventionally used in this field and operating under reduced pressure. The reactor in its entirety is heated to the temperature required for the deposition, so that the walls, the reactive gas phase circulating in the reactor and thus the atmosphere of the reactor, and the substrate to be covered are at the same temperature. This type of reactor is also known as "isothermal" (or "quasi-isothermal" when several temperature gradients exist).

A cold-wall reactor can also be used. In the cold-wall reactor, only the substrate is heated, with the result that the reaction is carried out only at the heated substrate. The yield of the reactor, determined from the consumption of precursor, is then low, which increases the advantage of a recycling of the reactants.

The principle of the DLI-MOCVD technique is to directly introduce, into the chamber of the chemical vapor deposition reactor, under continuous or pulsed conditions, a precursor of the metal to be deposited in vaporized form. In order to do this, a molecular solution of the metallic precursor is introduced into an evaporator from a feed tank under pressure (for example, under 3 bars of inert gas ($N_2$), i.e. $3.10^5$ Pa) containing said precursor in a solvent. This mother solution is split up into microdroplets in order to form an aerosol which is vaporized in flash fashion. "Flash" evaporation consists in rapidly vaporizing a compound outside the conditions of pressure and of temperature predicted by its saturated vapor pressure law. The evaporator is heated to a temperature such that the precursor and its solvent are vaporized, without, however, bringing about decomposition at this stage. The vaporization temperature is generally between the boiling point of the solvent and the decomposition temperature of the precursor (and incidentally of the solvent), typically between 100° C. and 250° C., for example in the vicinity of 150° C., indeed even 200° C.

The parameters for injection of the precursor solution are preferably fixed using a computer program. They are adjusted so as to obtain a mist of very fine and numerous droplets, in order to obtain a satisfactory flash evaporation under reduced pressure. The liquid injection thus constitutes a well-controlled source of organometallic precursor, which does not limit the possibilities of optimization of the parameters of the process for deposition of the coating.

The vaporized precursor and the vaporized solvent are entrained by a stream of neutral gas (or generally a gas which is chemically inert with regard to the chemical entities present in the CVD reactor) from the evaporator toward the deposition zone of the reactor. The substrate to be covered does or does not rest on a sample holder placed in the reactor. The carrier gas used is preferably preheated at the most to the temperature of the evaporator, in order to obtain effective vaporization. Nitrogen is generally chosen for its low cost but helium, which benefits from a better thermal conductivity, or argon, the protective capacity of which is greater, can also be employed.

According to the process of the invention, the transition metal M to be deposited is typically chromium, or any other metal, the chemistry and the metallurgy of which are similar to those of chromium. A person skilled in the art knows the elements for which the properties of hardness and of chemical inertia required in metallurgy are obtained. The transition metal M is furthermore capable of forming a bis(arene) compound.

Thus, according to the invention, the transition metal M to be deposited can be chosen from Cr, Nb, V, W, Mo, Mn or Hf, preferably at the zero oxidation state. More particularly, the transition metal is chosen from Cr, Nb, V or Mo as their carbides are very stable.

The deposits produced are generally ceramic coatings (for example of carbide type) or metal coatings (metal or alloy). The transition metal M generally retains its degree of oxidation in the protective coating deposited, as the precursor decomposes thermally without complex reaction, such as, for example, an oxidation/reduction reaction, which generates numerous byproducts.

Preferably, the transition metal M (more particularly chromium) is at the zero oxidation state in the precursor of bis(arene) type and also in the protective material deposited by the process of the invention. This is because, in the specific case of carbides, for example, the latter being insertion carbides, the transition metal M generally retains the zero oxidation state.

The mother solution employed in the deposition process of the invention contains a precursor of bis(arene) type containing the transition metal M, a hydrocarbon solvent devoid of oxygen atom and, if appropriate, a carbon-incorporation inhibitor.

The precursor organometallic compound is a molecular compound in which a transition metal M, intended to react in order to form a protective coating on the substrate, is complexed with organic ligands which are two arene groups, in order to form a precursor of bis(arene) type. These ligands confer, on the precursor, the desired thermal stability in the chosen temperature range. When the protective layer comprises several transition metals M (for example in the case of a mixed carbide or of an alloy), the mother solution comprises a mixture of the precursors of bis(arene) type, each comprising its own transition metal M.

According to the invention, the precursor is preferably a sandwich compound of bis(arene) type devoid of oxygen atom, of general formula (Ar)(Ar')M, where M is the transition metal M at the zero oxidation state ($M_0$) and Ar and Ar', which are identical or different, each represent an aromatic group of the type of benzene or benzene substituted by at least one alkyl group.

The stability of the metal-ligand bond substantially increases with the number of substituents of the benzene ring. In order to promote the decomposition of the precursor, a precursor in which Ar and Ar' represent two low substituted aromatic ligands can be chosen. Thus, according to the invention, the aromatic groups Ar and Ar' each preferably represent a benzene radical or a benzene radical substituted by from 1 to 3 identical or different groups chosen from a methyl, ethyl or isopropyl group.

Particularly advantageously, it transpired that the mother solution could provide the reaction with different precursors without negatively influencing the process. In particular, the exact nature of the aromatic ligands of the transition metal M is not critical, provided that these ligands belong to the same chemical family of low substituted monocyclic aromatic compounds. Advantageously, the reintroduction into the reactor of byproducts of the CVD reaction derived from the initial reactants is then possible, this being the case even if the products collected at the reactor outlet have different chemical structures. The purity of the initial mother solution is not a critical point either, which makes it possible to use commercial solutions which can contain up to 10% of derived compounds. As it is possible to recycle these derived compounds in the process itself, the recycled mother solutions which will be used for a subsequent deposition will contain different bis(arene)s as precursors.

Thus, according to a preferred characteristic of the invention, said mother solution can contain a mixture of several precursors of bis(arene) type comprising the metal M, of different general formulae (Ar)(Ar')M, in particular of different general formulae $(Ar)(Ar')M_0$.

By way of example, when the metal is chromium, in particular in the zero oxidation state, the precursor can be a sandwich chromium compound, such as bis(benzene)chromium (known as BBC, of formula $Cr(C_6H_6)_2$), bis(ethylbenzene)chromium (known as BEBC, of formula $Cr(C_6H_5Et)_2$), bis(methylbenzene)chromium (of formula $Cr(C_6H_5Me)_2$) and bis(cumene)chromium (of formula $Cr(C_6H_5iPr)_2$), or their mixture. It can also be an asymmetric derivative of formula (Ar)(Ar')Cr, where Ar and Ar' are different; or a mixture of these bis(arene)chromium compounds which can be rich in one of these compounds. These precursors all decompose starting from approximately 300° C. The precursors exhibiting a decomposition temperature of greater than 600° C. are excluded, in order to prevent the decomposition of the solvent, for the reasons explained later. The chemical formulae of the chromium precursors which precede can be transposed to the precursors comprising the transition metal M by replacing the chromium therein with one of the other transition metals M, in particular in the zero oxidation state. The precursor of bis(arene) type comprising the element $M_0$ can thus be chosen from at least one compound of formula $M_0(C_6H_6)_2$, $M_0(C_6H_5Et)_2$, $M_0(C_6H_5Me)_2$ or $M_0(C_6H_5iPr)_2$.

Only BBC exists in the form of a powder. It can be injected in the form of a solution but the concentration is then rapidly limited by its low solubility in hydrocarbon solvents.

The other precursors mentioned by way of example are liquid and can be directly injected without solvent, but it is then more difficult to control the microstructure of the deposits. Their use in solution is thus preferred as this makes possible a wide variation in the concentration of said mother solution, better adjustment of the injection conditions and consequently of the physical properties.

The concentration in the mother solution of the precursor of bis(arene) type comprising the transition metal M can be between 0.1 mol·l$^{-1}$ and 4.4 mol·l$^{-1}$ (concentration of the pure precursor), generally between 0.1 mol·l$^{-1}$ and 1 mol·l$^{-1}$, typically 0.35 mol·l$^{-1}$.

The solvent of the precursor compound plays an important role in the satisfactory implementation of the deposition process according to the invention. It preferably meets all of the following chemical and physical criteria:

its boiling point is less than the temperature of the evaporator in order to make possible flash evaporation in the evaporator.

it does not contain oxygen in order to avoid oxidation of the deposits by cracking of the solvent employed in the deposition zone.

it is chemically inert with regard to the precursor in solution and liquid under the standard conditions of temperature and pressure. In the present description, the standard conditions are atmospheric pressure and a temperature of 25° C.

it efficiently dissolves the precursors, to which it is chemically close when it is of aromatic nature.

it does not significantly decompose in the reactor, in order to limit as much as possible any contamination with the objective of recovering the solvent in the effluent at the outlet of the reactor.

Thus, the solvent is preferably a monocyclic aromatic hydrocarbon of general formula $C_xH_y$, which is liquid under the standard conditions and which has a boiling point of less than 150° C. and a decomposition temperature of greater than 600° C.

The solvent advantageously belongs to a chemical family close to that of the ligands of the precursor compound, namely the family of the aromatic hydrocarbons, also known as "arenes". This is because, during the passage through the reactor, the precursor decomposes thermally, releasing its ligands one after the other. The byproducts of the reaction are thus essentially free arenes which mix all the better with the solvent as they are chemically close to it, indeed even identical to it. For this reason, the compounds collected in the effluent at the reactor outlet (precursor, byproducts of the CVD reaction and solvent) are generally all aromatic hydrocarbons. Aliphatic byproducts of the alkane/alkene type comprising from 2 to 4 carbon atoms and which originate from the decomposition of the aromatic solvent are probably present in a small amount. As described in detail later, these compounds, which are gaseous under the standard conditions, will not be collected in step c) of the process, in contrast to the compounds collected, which are, for their part, liquid.

Thus, according to the invention, the solvent is preferably chosen from benzene or benzene substituted by one or more identical or different groups chosen from a methyl, ethyl or isopropyl group.

According to a particularly preferred embodiment of the invention, the solvent is benzene, toluene, ethylbenzene, mesitylene (1,3,5-trimethylbenzene) or their mixtures. However, in practice, benzene is excluded due to its high toxicity, among others as known carcinogen.

When it is desired to obtain the deposition of a hard metal coating (namely of metal or alloy type) on the substrate, a carbon-incorporation inhibitor is preferably added to the mother solution, for example at a concentration equal to 1% to 10% of the molar concentration in the mother solution of the precursor of bis(arene) type, for example 2%.

This additive, preferably a chlorine-comprising or sulfur-comprising additive, has the role of preventing or limiting the heterogeneous decomposition of the aromatic ligands of the precursor. This is because, during the dissociation of the metal-ligand bonds, a portion of the hydrocarbon ligands decompose under the catalytic effect of the surface of the substrate and contribute their carbons, which bond with the transition metal to form ceramics of carbide or mixed carbide type. A small amount of carbon can also be deposited with the transition metal M during step b), without, however, forming a carbide, even in the presence of the inhibitor.

This is why, in an alternative embodiment of the process according to the invention, said mother solution further contains a chlorine-comprising or sulfur-comprising additive, devoid of oxygen atom and with a decomposition temperature of greater than 600° C., in order to obtain the protective material composed of the transition metal M or of the alloy of the transition metal M. Under the standard conditions, this additive is furthermore miscible in the mother solution.

As indicated above, it is advantageous for the compounds introduced into the reactor to be able to be recycled (themselves or their byproducts) without affecting the reaction for deposition by DLI-MOCVD. The additive is thus preferably a monocyclic aromatic hydrocarbon substituted by a thiol group or at least one chlorine. More preferably, the additive is thiophenol ($C_6H_5SH$) or hexachlorobenzene ($C_6Cl_6$).

As regards the deposition conditions of the process of the invention, the chamber of the reactor is heated to a deposition temperature of between 300° C. and 600° C., in order to decompose the precursor of bis(arene)metal type, without, however, degrading the solvent: this prevents or at the very least limits the production and the deposition of undesirable byproducts in the reactor and on its walls, indeed even on the substrate.

If the substrate to be covered is made of metal (composed, for example, of an alloy or of a native metal), the deposition temperature generally does not exceed the temperature beyond which the mechanical strength of the metal substrate declines (for example, a withstand temperature of 550° C.). This precaution prevents possible deformations or phase transformations of the metal substrate.

The reactor is placed under reduced pressure in order to carry out the main steps of the deposition, from the vaporizing of the mother solution containing the precursor as far as the extraction of the effluent in step c) of collecting the fraction of the gaseous effluent. The reduced pressure is generally from a few Torr to a few tens of Torr. These are thus moderately reduced pressures from the viewpoint of the pressures of approximately $10^{-3}$ Torr to $10^{-4}$ Torr of industrial PVD processes which require items of high vacuum equipment.

Thus, according to a preferred characteristic of the invention, step b) of vaporizing and deposition and step c) of collecting said fraction of the effluent are carried out so that the atmosphere of the chamber of the reactor is at a reduced deposition pressure of between 1 Torr and 50 Torr (i.e., in SI units, between 133 Pa and 6666 Pa) and alternatively between 13 Pa and 7000 Pa.

On conclusion of steps a) and b) of the deposition process of the invention, a protective coating composed of the protective material covers the substrate. This protective material can contain one or more transition metals M in the form of a carbide, of an alloy or of a metal.

The carbide of the transition metal M composing the protective material is obtained in the absence of carbon-incorporation inhibitor in the mother solution. It can be a carbide of CrC, WC, NbC, MoC, VC or HfC type, or of stoichiometric formula $Cr_7C_3$, $Cr_3C_2$, $Mo_2C$, $Mn_3C$, $V_2C$ or $V_4C_3$. When they do not comprise stoichiometric indices (case for the carbides of CrC, WC, NbC, MoC, VC or HfC type), these designations do not correspond to a defined stoichiometric formula but to a common notation, as these carbides of the transition metal M are insertion carbides in which the amount of carbon can vary within limits known to a person skilled in the art. For example, CrC denotes generally a chromium carbide, which can also be denoted "$CrC_x$": the coefficient x indicates that the carbide does not have exactly the stoichiometry of one of the three stable chromium carbide compounds ($Cr_{23}C_6$; $Cr_7C_3$; $Cr_3C_2$). Its composition may be close to $Cr_7C_3$ but intermediate with that of $Cr_3C_2$.

The carbide comprising the transition metal M can also be a carbide of an alloy of the transition metal M, optionally a mixed carbide, as mentioned in the present description.

The alloy of the transition metal M composing the protective material is preferably a base alloy of the transition metal M.

The alloy of the transition metal M or its base alloy can be any alloy known to a person skilled in the art comprising the transition metal M chosen from Cr, Nb, V, W, Mo, Mn, Hf or their mixtures. Preferably, it is a chromium-based alloy chosen more particularly from a chromium/vanadium alloy, a chromium/niobium alloy, a chromium/vanadium/niobium alloy or chromium/molybdenum alloy.

An alloy of the transition metal M can be obtained by mixing different organometallic precursors in the mother solution: for example, in order to obtain a chromium/vanadium alloy, the mother solution comprises a mixture of a precursor of bis(arene) type comprising chromium and of a precursor of bis(arene) type comprising vanadium, each precursor being, for example, present in the mother solution according to a molar ratio between these two precursors which corresponds to the stoichiometric chromium/vanadium ratio in the corresponding chromium/vanadium alloy.

The metal composing the protective material is generally the transition metal M in native form (or virtually pure form) which can preferably be chromium, vanadium, niobium or molybdenum.

The protective material comprising the transition metal M can contain manufacturing impurities. The natures and the contents of these impurities are generally the natures and contents typical of the impurities of industrial metal or ceramic materials. Generally, the contents of the unavoidable impurities are less than 200 ppm, preferably less than 100 ppm, more preferably still less than 50 ppm.

The gases which pass through the reactor are those which were introduced upstream. At the outlet of the reactor, the gaseous effluent comprises precursor molecules, the solvent (and the chlorine-comprising or sulfur-comprising additive, if appropriate), which have not been consumed or pyrolyzed. The effluent also comprises aromatic byproducts of the precursor, in particular dissociated free ligands originating from the precursor, which are of the same aromatic family as the solvent. They are incorporated in the base solvent, with which they are fully miscible, and then themselves act as solvent.

Surprisingly and particularly advantageously, the majority of the compounds at the outlet of the reactor at low temperature are monocyclic aromatic molecules, with a chemical structure similar or identical to that of the initial compounds, which are the precursor or the solvent. It is thus advantageous to save them, namely to collect them during step c). They are gaseous at the reactor outlet as a result of the temperature and pressure conditions, but liquid under the standard conditions. The mixture thus collected forms a solution, known as daughter solution, which can be introduced into the feed tank of the reactor as new mother solution capable of being used in step a) of the coating process.

However, the effluent also comprises compounds derived from the aromatic molecules by thermal fragmentation, and also byproducts of the reaction of the precursor with the substrate. These fragments resulting from the decomposition of $C_6$ aromatic compounds are essentially light aliphatic hydrocarbons of $C_2$ to $C_4$ alkane, alkene or alkyne type. In order to efficiently collect the compounds intended to form the daughter solution, it is possible to take advantage of the difference in the condensation temperatures between the aromatic compounds and the light hydrocarbons. The advantageous entities (thus essentially the arenes) can be distinguished by their melting point: they can thus be collected in step c) by virtue of a device capable of bringing about their condensation within a predefined temperature interval. The light hydrocarbons, although in subsidiary amount, can then be removed.

Thus, according to a preferred embodiment of the invention, in step c), the collecting of said fraction at the outlet of the reactor comprises an operation of selective condensation of the entities present in the effluent at the outlet of the reactor.

A suitable device for capturing, by selective condensation, the unconsumed precursor and the unconsumed solvent, and also the aromatic byproducts of the CVD reaction, is, for example, a cryogenic trap. This type of trap, which can fall as far as the boiling point of liquid nitrogen, consists of a part which forces the gas phase to pass through a pipe which is sufficiently cooled to cause these entities to condense. It can be adjusted within a range of temperatures which is appropriate for condensing and solidifying the gaseous entities to be recycled, preferably between $-200°$ C. and $-50°$ C. The temperature depends on the cryogenic bath chosen ($-100°$ C. with a supercooled ethanol trap and $-200°$ C. approximately with a liquid nitrogen trap), and is adjustable (reference may be made, for example, to the tables of data published in the work "Handbook of Chemistry and Physics, CRC Press").

Preferably, according to the invention, the selective condensation of the entities present in the effluent is carried out by cryogenic trapping at a temperature of between $-200°$ C. and $-50°$ C.

As this cryogenic trapping operation takes place at the reduced pressure prevailing in the system, it is subsequently advisable to break the vacuum via an inert gas inlet and to return to ambient temperature, which can be carried out by a method known to a person skilled in the art. A liquid fraction which is the daughter solution is thus saved.

Thus, according to the invention, said condensed fraction is brought back to the standard temperature and pressure conditions, and the entities remaining in the liquid phase, which form a daughter solution, are retained. The gaseous entities are, for their part, removed: this is because, as light and very volatile aliphatic hydrocarbons, they are much less efficiently trapped than the other entities with a cryogenic trap. They are partially removed during the selective condensation. Then, being in the gas state under the standard conditions, they are easily entrained by the vacuum pump equipping the cryogenic trap.

This exhibits an important advantage, since the bulk of the material of the effluent is trapped in order to recycle it. The trapping of the entities to be recycled can also be carried out for sampling purposes, for example in order to carry out subsequent analyses (ex situ diagnosis).

The small-sized entities formed during the reaction are not very numerous in amount and in nature. It has been confirmed experimentally that the trapped effluents at the reactor outlet are a mixture a) of unconsumed precursor, b) of solvent of the mother solution which has not been pyrolyzed, and c) of free ligands (with optionally a chlorine-comprising or sulfur-comprising additive). A few organic compounds derived from the decomposition of the ligands may be present in very small amounts.

On conclusion of step c) of the process of the invention, a daughter solution characterized by an admittedly lower precursor/solvent ratio than that of the mother solution is obtained, but virtually without other organometallic source capable of affecting the deposition mechanism. This result was unforeseeable as it is generally accepted that the decomposition of organometallic compounds, such as the precursors of bis(arene) type, results in the formation of numerous byproducts, some of which can recombine with the metal released to give new compounds very different in their thermal behavior among others. It is noteworthy that, contrary to the general case, all the metal originating from the decomposition of the precursor participates in the deposition of the coating, without reacting with compounds formed in the reactor. No new organometallic derivative is thus formed during the reaction.

On conclusion of a deposition operation (essentially constituted by steps a) and b) of the deposition process of the invention), the trapped daughter solution can be reused in a second deposition operation (noncontinuous mode) or in a loop recycling system which can be automated (continuous mode).

This is because the daughter solution collected contains the precursor, which can be reused and recycled in the deposition process of invention, this being the case even if the final concentration of the precursor in the daughter solution is lower than its initial concentration in the mother solution.

In order to know this final concentration of precursor in the daughter solution saved, a spectrocolorimetric method, followed by comparison with a calibration line, can be used, optionally in the form of an in-line device incorporated in the item of CVD equipment.

According to a preferred embodiment of the invention, step c) of collecting said fraction at the outlet of the reactor is thus followed by a step c1) of determination of the concentration of the precursor in the daughter solution obtained.

Depending on the results of this determination, the concentration of precursor in the mother solution can be adjusted, for example in order to modify the rate of deposition of the protective layer according to step b) of the deposition process of the invention. This adjustment in concentration can consist of an addition of pure precursor to the daughter solution, which solution will be introduced in order to reconstitute a mother solution, or of an addition of pure precursor directly to the feed tank in order to supplement the new mother solution.

Thus, the process according to the invention can comprise, in step d), an operation d0) of adjustment of the concentration of precursor, as a function of the concentration of the daughter solution poured into the feed tank.

Alternatively, it is possible to take a basis, not on the concentration, but on the amount of precursor collected. In this case, a volume of daughter solution introducing the desired amount of reactant is introduced into the feed tank. This last way of proceeding is convenient. It is rendered possible by the tests carried out showing that the concentration of precursor is not a critical parameter of the reaction dynamics.

According to a specific embodiment of the invention, the deposition process can be carried out batchwise, in a noncontinuous manner. In this case, the daughter solution collected on conclusion of step c) is saved and subsequently poured into the feed tank, for the treatment of a new substrate. If this treatment is not carried out immediately, the solution is placed in a storage tank with satisfactory storage conditions: step c) of collecting said fraction can then be followed by a step c2) of storage of the daughter solution obtained. This storage is ideally carried out in a refrigerated container with the exclusion of light, under an inert atmosphere, for example under argon pressure, or pressure of another dry gas ($N_2$, for example), provided that it is not oxidizing.

The daughter solution saved is less concentrated in precursor than was the mother solution initially used, so that the amount of precursor collected is generally insufficient to carry out a new deposition operation. The precursor then has to be trapped (for example by selective condensation) for at least two CVD deposition operations in order to have sufficient daughter solution for a new deposit with a similar thickness to that obtained during the use of the initial mother solution, which is generally of at least 1 µm in thickness. The daughter solutions generated during different deposition operations can advantageously be saved, in order to accumulate a sufficient amount of precursor to feed the tank of mother solution for a new deposition operation.

Advantageously, steps a) to c) of the deposition process according to the invention can be repeated sequentially N times, on conclusion of which the N daughter solutions were saved, and then step d) is carried out by pouring said N daughter solutions into the feed tank in order to obtain a new mother solution capable of being used in step a).

Alternatively, according to another specific embodiment of the invention, the deposition process is carried out according to a noncontinuous mode as described above, in which the N solutions can be stored as they are collected: step d) is then carried out subsequently.

Once the desired amount of new mother solution saved is approximately reached, its concentration of precursor can be determined by quantitative analysis and optionally adjusted. Subsequently, the tank containing the new mother solution can be directly connected to the injection system for a new deposition operation. If appropriate, the CVD deposition reactor is cleaned beforehand with a pure solvent present in a tank connected to the injection system. One of the advantages of steps c) and d) of the deposition process of the invention is thus to minimize the loss of organometallic precursor, which improves the environmental impact and overall decreases the cost of the DLI-MOCVD process.

In noncontinuous mode, the protective coating can be advantageously constituted of several layers of different compositions or natures, in order to form a heterogeneous multilayer protective coating. This coating is then generally obtained by a process which carries out a sequenced deposition of each monolayer deposited during a cycle of the deposition process. The deposition of each layer can thus be separated by a pause time, for example of between 1 minute and 10 minutes. This pause can be taken advantage of to purge the chemical vapor deposition reactor.

According to another embodiment which is particularly advantageous from an industrial viewpoint, the deposition process of the invention is carried out continuously. In this case, the daughter solution obtained from the entities collected, in particular by selective condensation, is reused in a loop. This is because these entities can be extracted continuously in the fraction of gaseous effluent collected in step c), as these are compounds of low volatility in comparison, among others, with the byproducts of decomposition of the aromatic ligands. They can for this reason be easily separated, for example by selective condensation in a cryogenic trap.

According to this alternative form, the daughter solution obtained in step c) is poured continuously into the feed tank, during the chemical vapor deposition process. Steps c) and d) can be controlled by an automatic system in order to ensure a circulation loop. A device makes it possible to pass from the low-pressure zone at the cryogenic trap up to the pressurized feed tank, by a pressure variation "line".

The recycling is not universally applicable in a CVD deposition process as it is related to the chemical system which is employed. It has been rendered possible in the deposition process of the invention only by virtue of a specific and judicious choice of the molecular precursors which is associated with a deposition of DLI-MOCVD type.

The satisfactory results obtained are all the more surprising as the chemical and structural characteristics of the coatings deposited are identical or very close, independently of the composition of the precursor or of the solvent of the mother solution injected, which has been confirmed experimentally. The physical and mechanical properties of these coatings are also, if not similar, at least comparable. Finally, and unexpectedly, it has been demonstrated that it is possible to very greatly increase the yield of the deposition process of the invention, up to virtually 100%. By virtue of such yields, protective layers can be continuously deposited on the substrate with the process of the invention in order to form a very thick protective coating.

Thus, the protective coating can have a mean thickness of between 1 µm and 50 µm, preferably between 10 µm and 50 µm, in order, among others, to promote the protection of the substrate.

A monolayer or multilayer (homogeneous or heterogeneous in composition) protective coating can be deposited with the deposition process of the invention. In a monolayer or multilayer protective coating, each protective layer can have a thickness of 1 µm to 50 µm, more preferably still of 1 µm to 25 µm, indeed even of 1 µm to 15 µm. Alternatively, at least one protective layer can have a thickness of 10 µm to 50 µm.

The protective coating can comprise from 1 to 50 protective layers.

Apart from the improvement in the environmental impact resulting from a virtually zero discharge of organometallic compounds, the cost of the process is greatly reduced by economizing on the organometallic precursor, which contributes significantly to the overall cost.

It may be advantageous to make economic use of the solutions prepared from the effluents collected on conclusion of the deposition process of the invention. This is because these solutions are complex in composition and they are sources of precursor for surface treatments by DLI-MOCVD. As indicated above, they can either be used in a loop directly in the process from which they originate or be stored for subsequent use. Beyond the advantages already mentioned, they therefore take on a specific commercial advantage. This is the case in particular as regards the organometallic precursors of bis(arene)chromium type which are supposed to be sensitive to air and to moisture. On the other hand, they are less reactive to the atmosphere when they are in solution. The recycled solutions thus, for this reason, have a protective effect with regard to the precursor.

The process of the invention makes it possible to deposit a protective coating which can be produced in a monolithic or nanostructured form, as multilayers of the same nature or different natures. It can be deposited on different metal (alloys, and the like), ceramic (carbides) or metalloid (for example, polycrystalline silicon) substrates, or substrates of yet other materials, provided that they are capable of withstanding a heat treatment at a temperature of between 300° C. and 600° C., or at least at approximately 550° C. These substrates are intended for various industrial fields, such as, for example, those of tools, the automobile industry, the aeronautical industry, the microelectronics industry or the technologies related to energy, such as, for example, the photovoltaic industry.

Thus, according to the invention, said substrate to be covered can be a part made of metal (namely, generally composed completely or essentially of native metal), of alloy, of ceramic or of silicon. The substrate can also be made of another material which withstands a heat treatment at approximately 550° C.

Other subject matters, characteristics and advantages of the invention will now be specified in the description which follows of specific embodiments of the process of the invention, given by way of illustration and without limitation, with reference to the appended Figures.

DESCRIPTION OF SPECIFIC EMBODIMENTS

Figure 1:
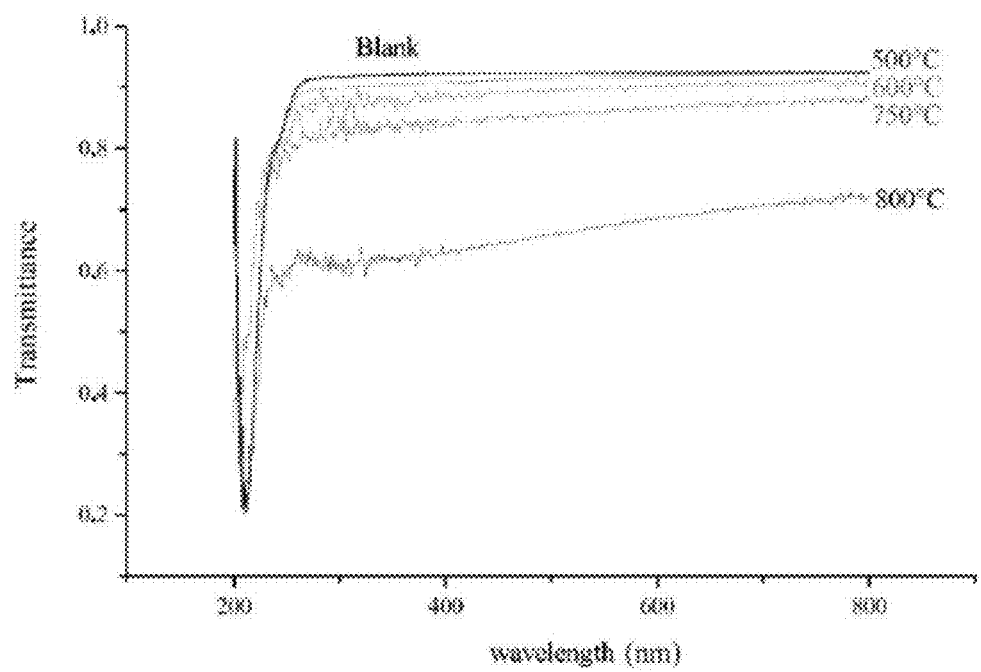
FIG. 1 shows the UV/visible spectra in transmittance of deposit-free quartz slides (Blank) and after treatment at 500° C., 600° C., 750° C. and 800° C. during the injection of toluene alone (without bis(ethylbenzene)chromium precursor).

The specific embodiments of the process of the invention relate to the deposition of coatings based on chromium (chromium carbides or chromium metal) by decomposition of the two precursors BBC or BEBC, in toluene taken as solvent.

Example 1: Deposition of Chromium Carbide

The deposition of a coating of chromium carbide CrC was carried out under the following conditions:
Injection conditions:
open time of the injector: 0.5 ms
frequency: 10 Hz
Reactant: BEBC (5 g)
Solvent: Toluene (50 ml)
Carrier gas: $N_2$ (flow rate of 500 sccm, namely 500 $cm^3$/min
under standard conditions)
Duration of the deposition: 20 minutes
Temperature of deposition in the reactor: 450° C.
Deposition pressure: 50 Torr
Vaporization temperature in the evaporator: 200° C.
Temperature of the cryogenic trap: −120° C.
Amount of daughter solution recovered: 30 ml Two experiments N1 and N2 were carried out with a BEBC mother solution. On conclusion of these experiments, two daughter solutions are collected by cryogenic trapping of a fraction of the gaseous effluent recovered at the outlet of the CVD reactor.

In a third experiment, the two daughter solutions recovered are combined in order to form a recycled mother solution which was used as source of precursor for carrying out a third deposition operation N3.

For N1 and N2, the thickness of the deposit is typically 5 μm. A deposit with a thickness of approximately 1.5 μm is obtained on conclusion of N3. The concentration of BEBC was determined and the yield calculated for N1 and N2 (see Table 1).

TABLE 1

| No. | Injected solution (ml) | [BEBC] in the injected solution (g/ml) | Daughter solution recovered (ml) | [BEBC] in the daughter solution (g/ml) | Yield with respect to the precursor (%) |
|---|---|---|---|---|---|
| N1 | 55 | 0.078 | 30 | 0.031 | 60% |
| N2 | 50 | 0.083 | 30 | 0.034 | 59% |
| N3 | 30 + 30 | 0.040 | 35 | Not measured, as very low | N/A |

Example 2: Deposition of Chromium Metal with Recycling of the Precursor

The deposition of a coating of chromium metal Cr was carried out under the following conditions:
Injection conditions:
open time of the injector: 0.5 ms
frequency: 10 Hz
Reactant: BEBC (5 g)
Solvent: Toluene (50 ml)
Additive: Thiophenol $C_6H_5SH$ (additive/precursor molar ratio=2%)
Carrier gas: $N_2$ (flow rate 500 sccm)
Duration of the deposition: 1 h
Temperature of deposition in the reactor: 450° C.
Deposition pressure: 50 Torr
Vaporization temperature in the evaporator: 200° C.
Temperature of the cryogenic trap: −100° C.
Amount of daughter solution recovered: 30 ml Two experiments were necessary in order to recover 60 ml of daughter solution. The mother solution thus recycled was reinjected into the CVD reactor in order to carry out a third deposition operation under the same conditions: a protective coating of approximately 1 μm is obtained.

Example 3: Choice of a Solvent: Toluene

In order to study if toluene can be used as solvent in the process according to the invention, it was confirmed that it does not decompose within the range of temperatures which are swept over by the process and under hydrodynamic conditions comparable to the true conditions of depositions by DLI-MOCVD.

Tests were carried out by injecting only toluene into the CVD reactor. Quartz slides are placed in the chamber of the CVD reactor on a sample holder and, after each deposition, a UV/visible transmittance spectrum was recorded. Several temperatures of the reactor were tested between 500° C. and 800° C. The spectra obtained are presented in FIG. 1. The spectrum of a control slide, which has not been subjected to deposition of carbon, is also represented (Blank).

Figure 2:
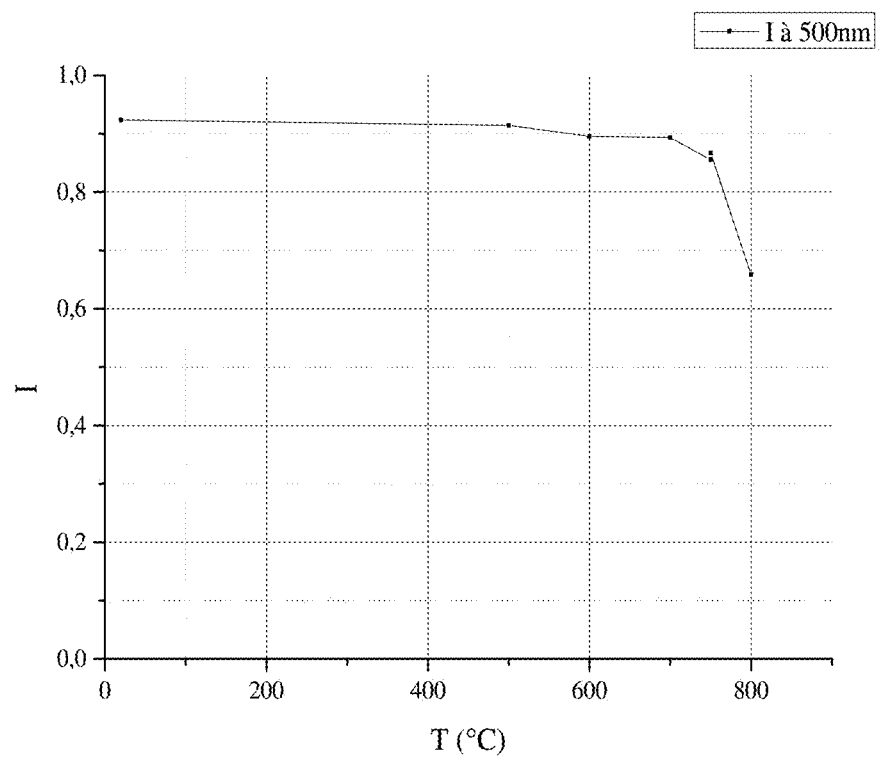
FIG. 2 exhibits the change in the intensity of the absorbance at the wavelength of 500 nm measured on the spectra in transmittance of FIG. 1 as a function of the pyrolysis temperature.

The mean transmittance at the wavelength of 500 nm was plotted for the different temperatures of the reactor. Above 600° C., it decreases because the quartz slide turns opaque following the formation of a thin film of carbon. It is justifiable to believe that toluene begins to decompose at this temperature, with an accentuation at 750° C., more marked still toward 800° C., as is shown by FIG. 2.

Consequently, toluene is an appropriate solvent for depositions for which the temperature does not exceed 600° C.

Furthermore, this result allows it to be believed that, when a bis(arene)chromium precursor decomposes with the release of the benzene ligands, the latter do not decompose either below 600° C. in the homogeneous phase.

Example 4: Assaying of the Precursors

Numerous techniques exist for determining the concentration of precursor of the solutions used, all more or less reliable and problematic to carry out. The concentration of precursor of the mother solution injected initially into the CVD deposition reactor is known. The concentration of the recycled daughter solution is to be determined.

For this, the concentration of BBC and of BEBC is determined by the change in their absorption band at 315 nm in the UV range, which is monitored by spectrophotometry (Douard, A., in Institut Carnot CIRIMAT. 2006, INP Toulouse). This absorption band corresponds to the M(4e2g) →L(5e2g) charge-transfer transition, brought about by the chromium-ligand bond of the precursor molecule, which bond will be cleaved in the initial phase of the mechanism of growth of the coating.

The principle thereof is as follows. The Beer-Lambert law, relating the concentration to the absorbance, is:

$$A = \varepsilon * C * l, \text{ with}$$

A: the absorbance of the solution at 315 nm;
ε: the molar extinction coefficient of the precursor;
C: the concentration of precursor;
l: the length of the cell.

Figure 3:
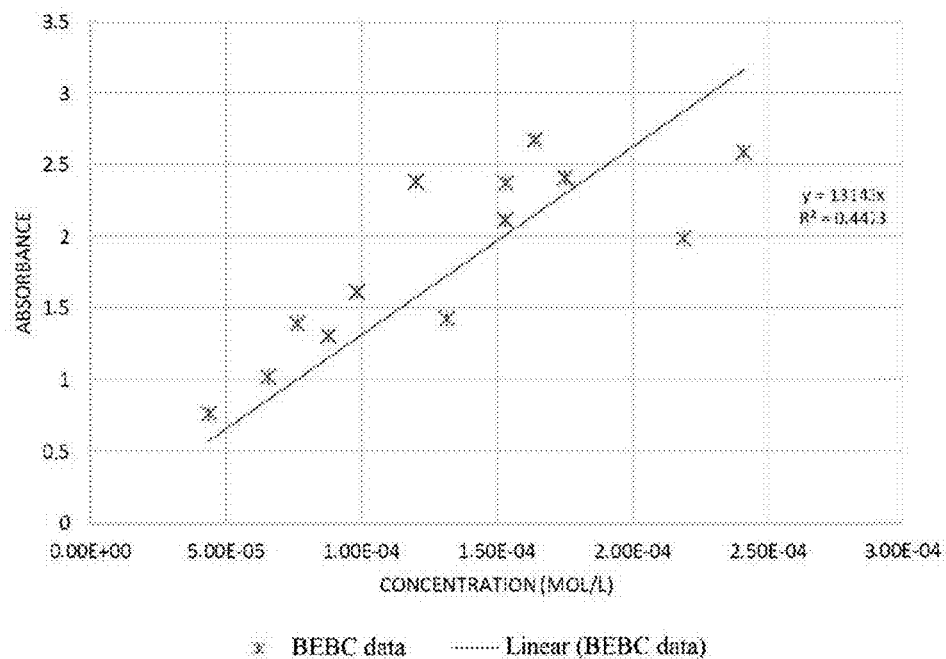
FIG. 3 represents a calibration line for BEBC in UV/visible spectrophotometry.

In order to construct a calibration line, known concentrations of BEBC or BBC solutions are related to the measurement of their absorbance (see FIG. 3). The concentration of any solution can subsequently be determined by UV/visible spectrophotometry: its measured absorbance is directly related to its concentration using the calibration line.

Access to the yields of the cryogenic trap of the CVD reactor is also possible. By withdrawing a small volume of daughter solution at the reactor outlet, its concentration can be determined in order to decide, if necessary, to enrich the daughter solution with precursor in order to reinject it subsequently into the system. The absorbance of the daughter solution can also be measured in line by incorporating an optic cell in the circuit for recovery of the daughter solution: this is a nondestructive analytical method.

Example 5: Coatings Obtained on Various Substrates

No definite basic mechanism has been put forward for accounting for the growth of chromium carbides or chromium metal by decomposition of the BBC or BEBC precursor, any more than the influence of the presence of toluene on the reaction mechanism has been explained. Further, the data available for operating temperatures of less than 600° C. are very scarce.

It has been demonstrated experimentally that the process of the invention makes it possible to deposit protective films and coatings exhibiting the desired characteristics.

A) the Characteristics of the Films do not Depend on the Concentration of Precursor of the Injected Solution.

Numerous variations in the parameters can cause the concentration of precursor of the injected solution to vary and, by extension, that of the reactive gas phase sent into the reactor. The films deposited by the process of the invention are nevertheless comparable. The following parameters were thus tested:

Nature of the precursor used: BEBC;
Injection parameters which modify the proportion of injected solution with respect to the flow rate of carrier gas: frequency between 1 Hz and 20 Hz; open time between 0.5 ms and 5 ms;
Relative amounts of precursor and of solvent: concentrations of precursor of $1.0 \times 10^{-2}$ mol·l$^{-1}$ to $5.0 \times 10^{-1}$ mol·l$^{-1}$.

The fact of injecting a solution based on fresh precursor and a solution based on recycled precursor does not change the characteristics of the films (see below). This is because the compositions of the protective coatings obtained, of the type of amorphous chromium carbides, with a composition close to $Cr_7C_3$, are always similar. The morphologies are also equivalent, with a typical microstructure of a homogeneous amorphous film, a completely dense and very smooth protective layer.

Colorimetric assaying by spectrophotometry has made it possible to measure that the mother solution based on recycled precursor was approximately 60% less concentrated in precursor than the mother solution based on fresh precursor, without impacting the quality of the films deposited.

Moreover, the fact that these characteristics are independent of the precursor/solvent ratio is consistent with previous results which have shown that MOCVD depositions (without solvent) are also comparable, just like DLI-MOCVD depositions (with solvent) with cyclohexane in place of toluene. This is consistent with the fact that the solvent is not involved in the mechanism of decomposition of the precursor and that it is not itself decomposed during the process.

B) Morphology, Microstructure (SEM, Roughness)

Figure 4:
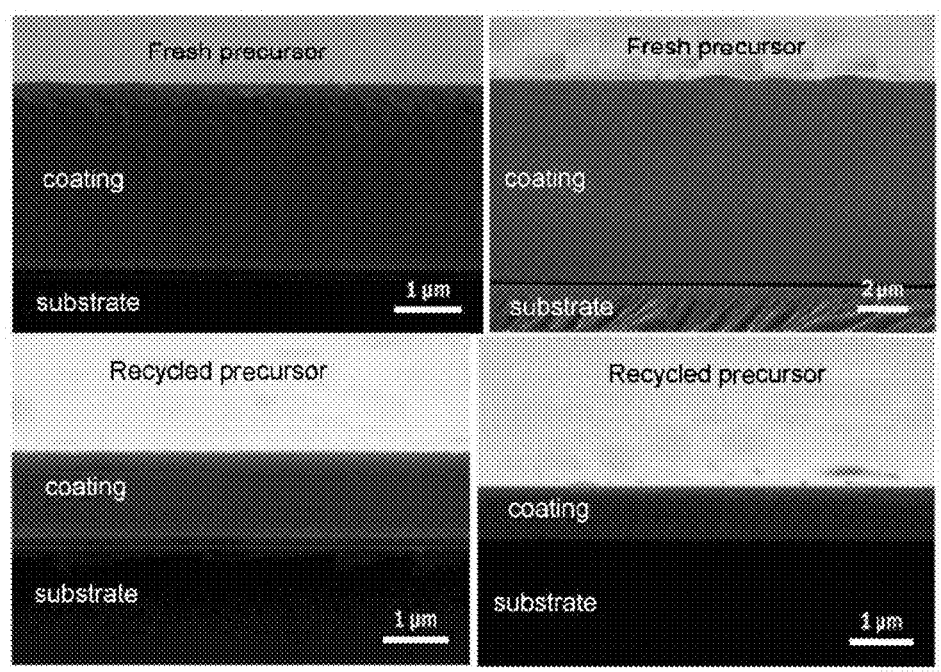
FIG. 4 exhibits a comparison of the microstructures of the coating obtained with fresh precursor and recycled precursor (views in section).

The microstructures of the protective coatings obtained from fresh or recycled mother solution are in every respect similar during the observations by Scanning Electron Microscopy (SEM). Each coating is dense, compact and homogeneous in thickness over the entire surface area of the sample, as shown in FIG. 4.

Figure 5:
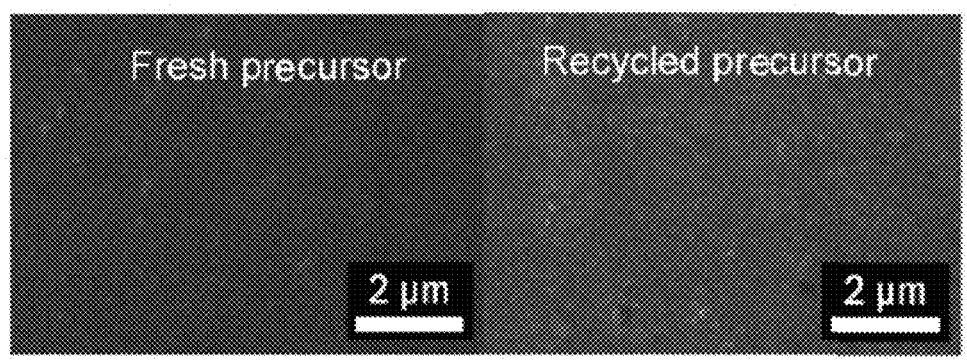
FIG. 5 exhibits a comparison of the microstructures of the coating obtained with fresh precursor and recycled (top views).

The interface with the Si substrate is well-defined. Furthermore, in top view (see FIG. 5), they have the same very smooth appearance without major heterogeneities but with a few surface contamination elements. The maximum thicknesses achieved with the fresh precursor are significantly greater than those with the recycled precursor, because the concentration of the recycled solution was lower. As much precursor is consumed in the reactor, only a small part is recovered using the cryogenic trap.

C) Composition (EDS, EPMA)

Figure 6:
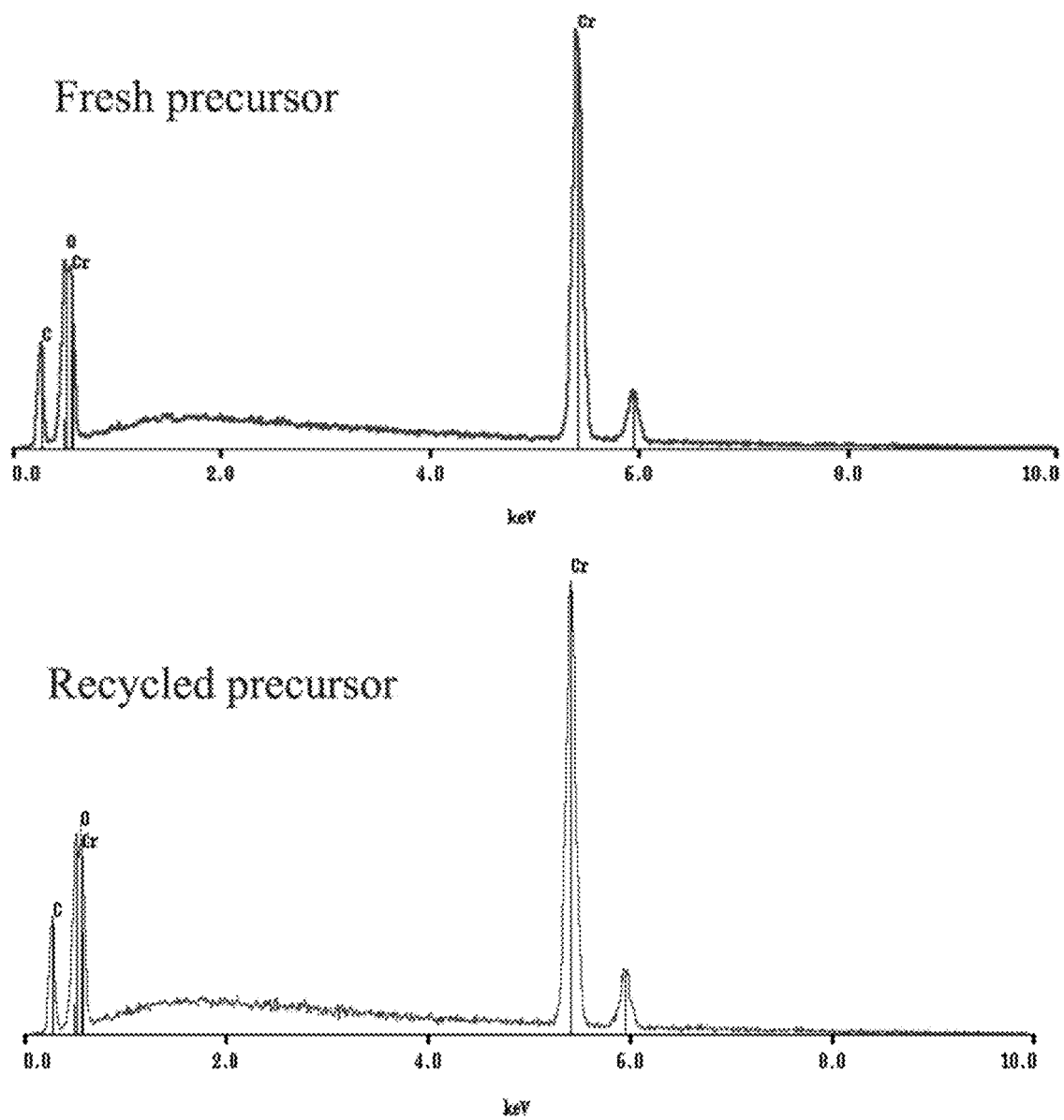
FIG. 6 exhibits a comparison of the Energy-Dispersive Spectra (EDS) of the coating obtained with fresh precursor (at the top) and recycled (at the bottom).

The EDS spectra are also comparable, with slight contamination with oxygen visible in both cases, fresh precursor or recycled precursor. The peaks of the chromium and the carbon have identical intensities, as is shown by the spectra in FIG. 6

The elemental compositions found with the Electron Probe MicroAnalysis (known under the English acronym "EPMA") analyses do not reveal any glaring disparity between the samples prepared with the fresh or recycled precursor:

BEBC-500° C. (amorphous): $Cr_{0.65}C_{0.32}O_{0.03}$ standardized at $Cr_{0.67}C_{0.33}$ and C/Cr=0.49
BEBC-450° C. (amorphous): $Cr_{0.64}C_{0.33}O_{0.03}$ standardized at $Cr_{0.66}C_{0.34}$ and C/Cr=0.52
recycled BEBC-450° C. (amorphous): $Cr_{0.64}C_{0.30}O_{0.05}$ standardized at $Cr_{0.68}C_{0.32}$ and C/Cr=0.48

As a reminder, the C/Cr ratio has the value of 0.43 for $Cr_7C_3$ and 0.66 for $Cr_3C_2$. The mean composition observed is thus very close to $Cr_7C_3$.

D) Structure (XRD)

Figure 7:
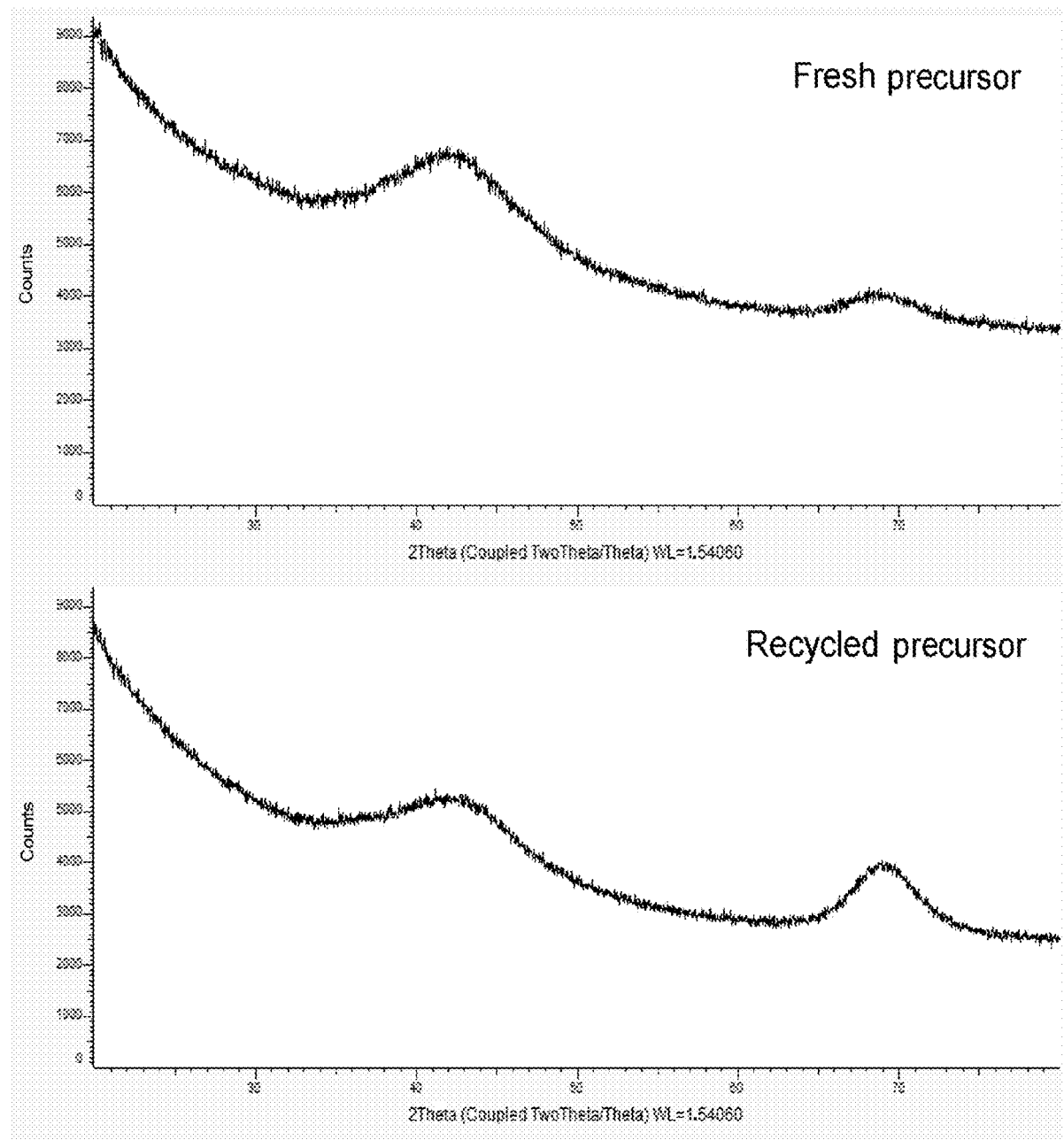
FIG. 7 exhibits a comparison of the X-ray diffractograms of a coating made of amorphous chromium carbides obtained with fresh precursor (at the top) and recycled precursor (at the bottom).

The analysis by X-Ray Diffraction (XRD) shows that the coatings are always amorphous, as is testified by the broad hump which is centered at approximately $2\theta=42°$. Examples of diffractograms obtained for a deposition starting from fresh and recycled precursor are presented in FIG. 7. The broad hump centered around $2\theta=69°$ is characteristic of the amorphous a-$Si_3N_4$ layer, which acts as barrier on the silicon substrate. It is present on the bare substrates and its contribution is greater when the deposit is thinner (case of the mother solution containing recycled precursor).

E) Mechanical properties: Hardness (nanoindentation)

The nanoindentation device is provided with an indenter of Berkovich type (triangular-based pyramid with an angle of 65.27° between the vertical and the height of one of the faces of the pyramid). The measures are carried out in accordance with the rule of the tenth: the indenter drives in by less than one tenth of the thickness of the coating. A measurement cycle is carried out in three steps:

increasing load up to the maximum load, in 30 s;
maintenance of the maximum load for 30 s;
unload for 30 s.

The nanoindentation measurements were carried out on samples coated starting from fresh precursor (thickness of 3.5 μm) and recycled precursor (thickness of 1 μm). The calculations made by the measurement and analysis software take into account a Poisson coefficient of the coating of 0.2. The measurements of hardnesses and of Young's modulus are presented in Table 2.

The values found for the coating deposited starting from recycled precursor are higher for the hardness but lower as regards the Young's modulus. They remain in any case consistent with values expected for a very hard coating.

TABLE 2

| Sample | Hardness (GPa) | Modulus (GPa) | Load (mN) | Driving in (nm) in proportion with the thickness |
|---|---|---|---|---|
| CrC 3.5 µm | 25 | 294 | 4 | ~100 (3%) |
|  | 21 | 296 |  |  |
|  | 21 | 292 | 3 |  |
|  | 24 | 280 |  |  |
| Mean | 23 | 291 |  |  |
| CrC 1 µm "recycled" | 32 | 260 | 3 | ~90 (9%) |
|  | 33 | 279 |  |  |
|  | 26 | 240 |  |  |
|  | 31 | 257 |  |  |
| Mean | 31 | 259 |  |  |

Example 6: Device for Deposition by DLI-MOCVD

A device for deposition by DLI-MOCVD which may be suitable for the implementation of the deposition steps a) and b) of the process of the invention is, for example, described in its main characteristics in the document WO 2008009714.

Figure 8:
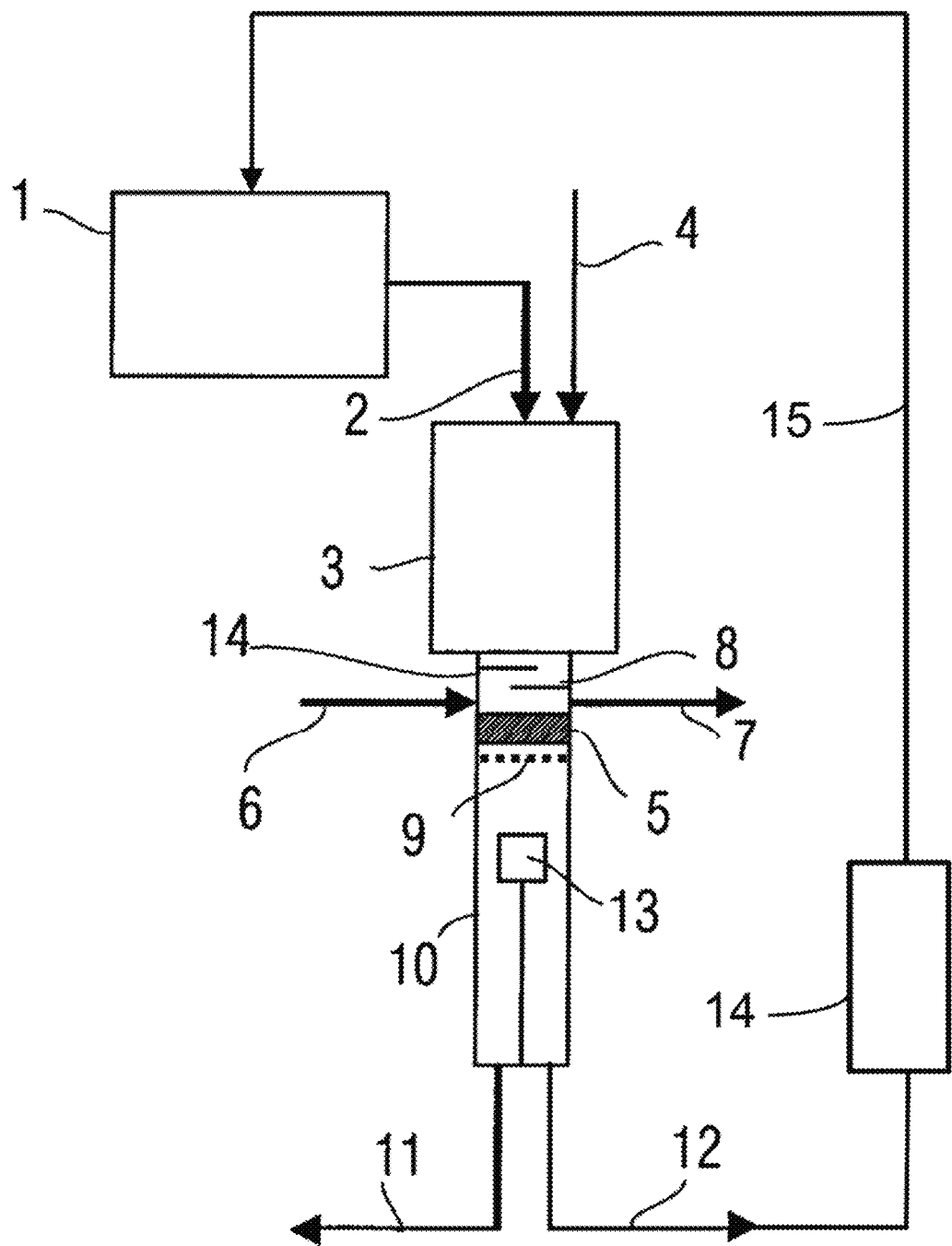
FIG. 8 is a diagrammatic view of a DLI-MOCVD device suitable for the implementation of the deposition process of the invention.

The DLI-MOCVD device which can be used for the deposition of the protective coating with the deposition process of the invention according to steps a) to d) comprises mainly a feed tank, an evaporator, an injector, a CVD reactor and a unit for collecting the daughter solution for the purpose of the recycling thereof in the device. This DLI-MOCVD device is described more specifically with reference to FIG. 8.

A pressurized feed tank 1 feeds the injector 2 with mother solution. The injector 2 is generally constituted of a commercial pulsed injection system, for example a diesel automobile injector.

The opening and the closing of the injector 2 can be computer-controlled, which makes possible the injection of the mother solution into the evaporator 3.

The evaporator 3 is positioned coaxially above the generally vertical CVD deposition chamber 10 into which it emerges.

A carrier gas feed line 4 emerges in the evaporator 3 next to the outlet of the injector 2. The stream of carrier gas entrains the vaporized mother solution from the evaporator 3 toward the CVD deposition chamber 10. At the inlet of the latter, a baffle 8 stops the possible unvaporized droplets at the outlet of the evaporator 3 and a screen 9 pierced with holes uniformly dispenses the gas stream. This screen 9 makes possible good distribution of the gas stream in the CVD deposition chamber 10, which contributes to a good surface state of the coatings and a uniformity in thickness being obtained.

A slide valve 5 can isolate the evaporator 3 from the remainder of the CVD deposition chamber 10: the volume thus delimited below the slide valve 5 comprises the CVD reactor proper in which is found the susceptor 13 on which the substrate to be covered is placed.

The additional pipe 6 above the slide valve 5 makes possible the arrival of a reactive gas, such as, for example, a carbon-incorporation inhibitor. The additional pipe 7 above the slide valve 5 makes it possible for the evaporator 3 to be pumped out during the cycles of purging or cleaning the latter. The collar 14 on which the connections of the additional pipes 6 and 7 are made, and also the slide valve 5 at the inlet of the CVD reactor, are heated to a temperature close to that of the evaporator 3.

A protective layer is deposited on the substrate starting from the vaporized mother solution in the CVD reactor.

On conclusion of this reaction of deposition by DLI-MOCVD, an outlet pipe 12 at the outlet of the CVD deposition chamber 10 collects a fraction of the gaseous effluent produced during the reaction. This fraction comprises the unconsumed precursor of bis(arene) type, the aromatic byproducts of the precursor and the solvent, indeed even, if appropriate, the carbon-incorporation inhibitor.

The outlet pipe 12 emerges on a selective condensation unit 14 (such as, for example, a cryogenic trap), in which the main undesirable compounds (in particular the light hydrocarbons) of the fraction of the gaseous effluent are removed, in order to produce a daughter solution.

When the deposition process of the invention is carried out continuously, a pipe 15 continuously dispatches the daughter solution thus produced in order to recycle it in the feed tank 1. A new mother solution is then formed for the purpose of the use thereof in a new cycle of the deposition process of the invention.

A backing pump 11 can be used to purge the whole of the DLI-MOCVD device, for example before a new deposition.

The invention claimed is:

1. Process for the deposition on a substrate of a protective coating composed of one or more layers, at least one being a protective layer comprising a transition metal M in the form of at least one protective material selected from the group consisting of a carbide, an alloy and a metal in native or virtually pure form, the deposition process being a process for the chemical vapor deposition of an organometallic compound by direct liquid injection (DLI-MOCVD) which comprises the following steps:
   a) having available, in a feed tank, a mother solution containing:
      a hydrocarbon solvent devoid of oxygen atom,
      said organometallic compound composed of a precursor of bis(arene) type having a decomposition temperature of between 300° C. and 600° C. and comprising the transition metal M, and
      if appropriate, a carbon-incorporation inhibitor;
   b) vaporizing said mother solution in an evaporator and then introducing said vaporized mother solution into a chemical vapor deposition reactor in which said substrate to be covered is found;
   c) depositing the protective layer on said substrate in the chamber of the reactor, the atmosphere of which is at a deposition temperature of between 300° C. and 600° C. under reduced deposition pressure, the deposition of the protective layer on said substrate comprising consumption of the precursor which comprises the production of a gaseous effluent comprising aromatic byproducts of the precursor;
   d) collecting, at an outlet of the reactor, a fraction of the gaseous effluent comprising the unconsumed precursor, the solvent and the aromatic byproducts of the precursor, the collecting step comprising an operation of selective condensation of said fraction of the gaseous effluent so as to condense the unconsumed precursor, the unconsumed solvent and the aromatic byproducts of the precursor, wherein the unconsumed precursor, the unconsumed solvent and the aromatic byproducts of the precursor together form, under standard conditions, a daughter solution; and
   e) pouring the daughter solution thus obtained into the feed tank in order to obtain a new mother solution capable of being used in step a).

2. Process according to claim 1, wherein step b) of vaporizing, step c) of reacting and depositing, and step d) of collecting said fraction of the effluent are carried out so that the atmosphere of the chamber of the reactor is at a reduced deposition pressure of between 133 Pa and 6666 Pa.

3. Process according to claim 1, wherein the transition metal M is chosen from Cr, Nb, V, W, Mo, Mn or Hf.

4. Process according to claim 3, wherein the transition metal M is at the zero oxidation state.

5. Process according to claim 3, wherein the protective material is a base alloy of the transition metal M.

6. Process according to claim 3, wherein the protective material is the transition metal M in native form, or is a virtually pure composition of a single transition metal M, each of any other chemical element in said protective material being present at a level of less than 0.5 atomic %.

7. Process according to claim 1, wherein the transition metal M is chromium.

8. Process according to claim 1, wherein the protective material is a carbide.

9. Process according to claim 8, wherein the carbide of the transition metal M composing the protective material is of CrC, WC, NbC, MoC, VC or HfC type, or has the stoichiometric $Cr_7C_3$, $Cr_3C_2$, $Mo_2C$, $Mn_3C$, $V_2C$ or $V_4C_3$.

10. Process according to claim 1, wherein the precursor of bis(arene) type is devoid of oxygen atom and has the general formula (Ar)(Ar')M, where M is the transition metal at the zero oxidation state (M 0) and Ar and Ar', which are identical or different, each represent an aromatic group of the type of benzene or benzene substituted by at least one alkyl group.

11. Process according to claim 10, wherein the aromatic groups Ar and Ar' each represent a benzene radical or a benzene radical substituted by from 1 to 3 identical or different groups chosen from a methyl, ethyl or isopropyl group.

12. Process according to claim 1, wherein the solvent is a monocyclic aromatic hydrocarbon of general formula $C_xH_y$, which is liquid under the standard conditions and which has a boiling point of less than 150° C. and a decomposition temperature of greater than 600° C.

13. Process according to claim 1, wherein said mother solution further contains, as carbon-incorporation inhibitor, a chlorine-comprising or sulfur-comprising additive, devoid of oxygen atom and with a decomposition temperature of greater than 600° C., in order to obtain the protective material composed of the transition metal M or of the alloy of the transition metal M.

14. Process according to claim 13, wherein the carbon-incorporation inhibitor is sulfur-comprising.

15. Process according to claim 1, wherein, in step d), aliphatic byproducts of the precursor and aliphatic byproducts of the solvent which are present in the effluent at the outlet of reactor are not condensed.

16. Process according to claim 1, wherein step d) of collecting said fraction is followed by a step d1) of determining the concentration of the precursor in the daughter solution obtained, and wherein step e) comprises an operation e0) of adjusting the concentration of the precursor, as a function of the concentration of the precursor of the daughter solution poured into the feed tank.

17. Process according to claim 1, wherein the concentration of the precursor in the daughter solution is less than the initial concentration of the precursor in the mother solution.

18. Process according to claim 1, wherein steps a) to d) are repeated sequentially N times and the N daughter solutions are saved, and then step e) is carried out by pouring said N daughter solutions into the feed tank in order to obtain a new mother solution capable of being used in step a).

19. Process according to claim 1, wherein the daughter solution obtained in step d) is poured continuously into the feed tank, during the chemical vapor deposition process.

20. Process according to claim 1, wherein the protective coating has a mean thickness of between 1 μm and 50 μm.

21. Process according to claim 1, wherein, in step d), the operation of selective condensation is performed with a cryogenic trap at a temperature ranging between −200° C. and −50° C.

* * * * *